(12) United States Patent　　(10) Patent No.: US 7,919,188 B2
Ayers　　(45) Date of Patent: Apr. 5, 2011

(54) LINKED PERIODIC NETWORKS OF ALTERNATING CARBON AND INORGANIC CLUSTERS FOR USE AS LOW DIELECTRIC CONSTANT MATERIALS

(75) Inventor: Michael Raymond Ayers, Palm Coast, FL (US)

(73) Assignee: Roskilde Semiconductor LLC, Las Vegas, NV (US)

( * ) Notice: Subject to any disclaimer, the term of this patent is extended or adjusted under 35 U.S.C. 154(b) by 735 days.

(21) Appl. No.: 11/806,465

(22) Filed: May 31, 2007

(65) Prior Publication Data

US 2008/0108774 A1　May 8, 2008

Related U.S. Application Data

(60) Provisional application No. 60/809,348, filed on May 31, 2006.

(51) Int. Cl.
　　*B05D 5/12*　　(2006.01)
(52) U.S. Cl. ........ 428/447; 428/450; 428/457; 427/384; 427/385.5; 427/387; 427/388.1
(58) Field of Classification Search ........................ None
See application file for complete search history.

(56) References Cited

U.S. PATENT DOCUMENTS

| | | |
|---|---|---|
| 4,002,800 A | 1/1977 | Nestler et al. |
| 4,652,467 A | 3/1987 | Brinker et al. |
| 4,987,101 A | 1/1991 | Kaanta et al. |
| 5,103,288 A | 4/1992 | Sakamoto et al. |
| 5,145,546 A | 9/1992 | Yuasa et al. |
| 5,177,248 A * | 1/1993 | Chiang et al. ............. 560/86 |
| 5,294,732 A | 3/1994 | Chiang et al. |
| 5,308,481 A | 5/1994 | Stalling et al. |
| 5,338,571 A * | 8/1994 | Mirkin et al. ............. 427/299 |
| 5,364,993 A | 11/1994 | Zhang et al. |
| 5,386,048 A * | 1/1995 | West et al. ............. 556/430 |
| 5,416,188 A | 5/1995 | Chiang et al. |
| 5,420,081 A | 5/1995 | Mattes et al. |
| 5,470,820 A | 11/1995 | Hauser et al. |
| 5,494,859 A | 2/1996 | Kapoor |
| 5,679,861 A | 10/1997 | Kuo et al. |
| 5,698,140 A | 12/1997 | Lamb et al. |
| 5,739,376 A | 4/1998 | Bingel |
| 5,744,399 A | 4/1998 | Rostoker et al. |
| 5,801,092 A | 9/1998 | Ayers |
| 5,851,503 A | 12/1998 | Mitani et al. |
| 5,965,202 A | 10/1999 | Taylor-Smith et al. |
| 6,066,272 A | 5/2000 | Tang et al. |

(Continued)

FOREIGN PATENT DOCUMENTS

EP　　0 647 606 A1　　4/1995

(Continued)

OTHER PUBLICATIONS

Peng et al, Journal of Sol-Gel Science and Technology, 22, pp. 205-219, 2001.*

(Continued)

*Primary Examiner* — Erma Cameron

(74) *Attorney, Agent, or Firm* — Sterne Kessler Goldstein & Fox PLLC

(57) ABSTRACT

This disclosure relates generally to polymeric networks of fullerene compounds, to methods of preparing precursors for such networks, and to their subsequent use as low dielectric constant materials in microelectronic devices.

14 Claims, 4 Drawing Sheets

U.S. PATENT DOCUMENTS

Figure 1:
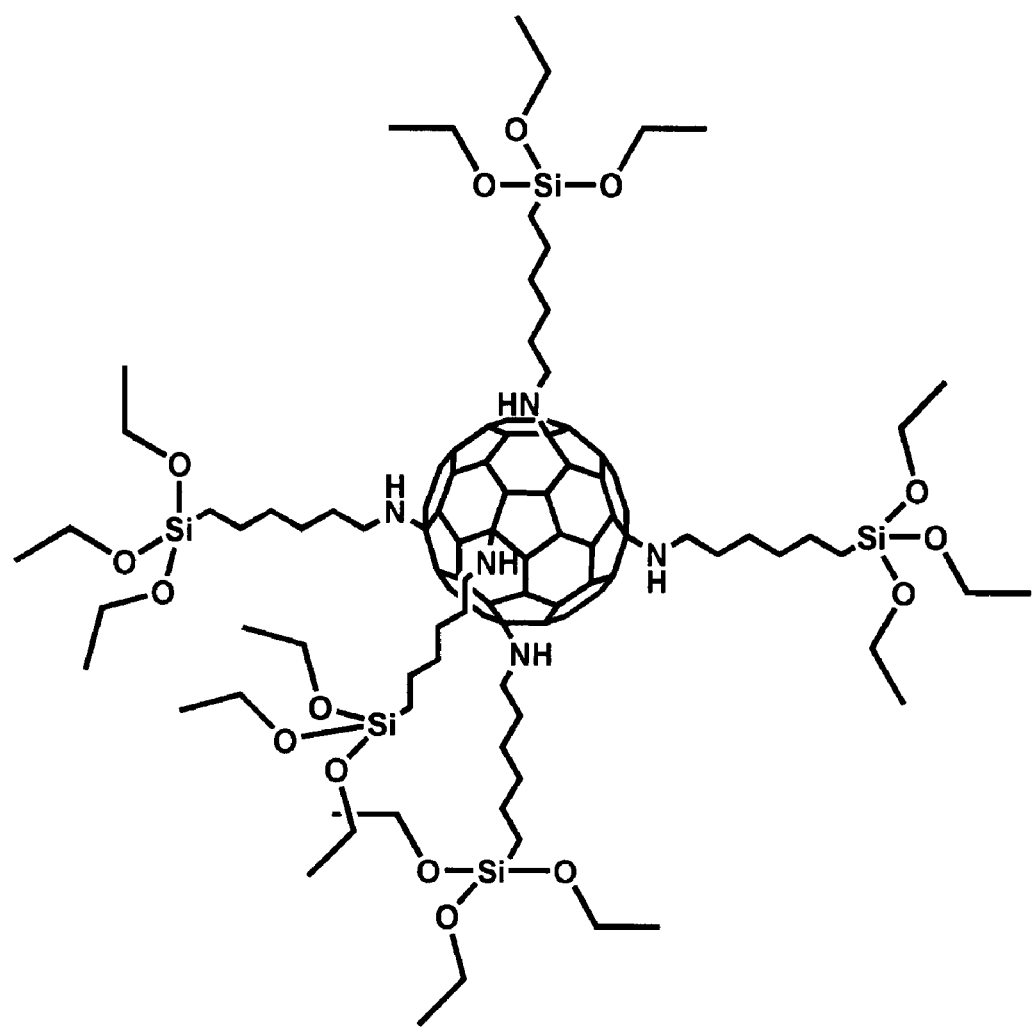

| | | | |
|---|---|---|---|
| 6,083,624 | A | 7/2000 | Hiura |
| 6,113,673 | A | 9/2000 | Loutfy et al. |
| 6,187,427 | B1 | 2/2001 | Taylor-Smith et al. |
| 6,214,746 | B1 | 4/2001 | Leung et al. |
| 6,255,241 | B1 | 7/2001 | Miyazawa et al. |
| 6,277,766 | B1 | 8/2001 | Ayers |
| 6,287,979 | B1 | 9/2001 | Zhou et al. |
| 6,342,454 | B1 | 1/2002 | Hawker et al. |
| 6,368,569 | B1 | 4/2002 | Haddon et al. |
| 6,380,270 | B1 | 4/2002 | Yates |
| 6,423,811 | B1 | 7/2002 | Lau et al. |
| 6,495,479 | B1 | 12/2002 | Wu et al. |
| 6,599,492 | B2 | 7/2003 | Iwamura et al. |
| 6,621,970 | B2 * | 9/2003 | Khudyakov et al. ......... 385/128 |
| 6,713,590 | B2 | 3/2004 | Lau et al. |
| 6,743,481 | B2 | 6/2004 | Hoehn et al. |
| 6,790,790 | B1 | 9/2004 | Lyons et al. |
| 6,797,777 | B2 | 9/2004 | Lau et al. |
| 6,855,202 | B2 | 2/2005 | Alivisatos et al. |
| 6,967,222 | B2 | 11/2005 | Khanarian et al. |
| 6,984,265 | B1 | 1/2006 | Raguse et al. |
| 6,987,147 | B2 | 1/2006 | Lau et al. |
| 6,998,178 | B2 | 2/2006 | Apen et al. |
| 7,011,890 | B2 | 3/2006 | Nguyen et al. |
| 7,014,681 | B2 | 3/2006 | Noack et al. |
| 7,060,204 | B2 | 6/2006 | Li et al. |
| 7,338,812 | B2 * | 3/2008 | Lin et al. ......... 436/528 |
| 7,531,209 | B2 * | 5/2009 | Ayers ............ 427/230 |
| 2001/0016608 | A1 | 8/2001 | Haddon et al. |
| 2001/0041801 | A1 | 11/2001 | Friedman et al. |
| 2002/0016414 | A1 | 2/2002 | Lau et al. |
| 2002/0037941 | A1 | 3/2002 | Lau et al. |
| 2002/0061397 | A1 | 5/2002 | Iwamura et al. |
| 2003/0072947 | A1 | 4/2003 | Lee et al. |
| 2003/0151031 | A1 | 8/2003 | Li et al. |
| 2003/0162002 | A1 | 8/2003 | Lau et al. |
| 2003/0187139 | A1 | 10/2003 | Lau et al. |
| 2003/0213958 | A1 | 11/2003 | Nakagawa et al. |
| 2004/0005506 | A1 | 1/2004 | Nishimura |
| 2004/0038408 | A1 | 2/2004 | Abbott et al. |
| 2004/0046155 | A1 | 3/2004 | Li et al. |
| 2004/0102584 | A1 | 5/2004 | Lau et al. |
| 2004/0121501 | A1 | 6/2004 | Large et al. |
| 2004/0132846 | A1 | 7/2004 | Leventis et al. |
| 2004/0175568 | A1 | 9/2004 | Takaguchi |
| 2004/0175581 | A1 | 9/2004 | Nguyen et al. |
| 2004/0180201 | A1 | 9/2004 | Veedu et al. |
| 2004/0185448 | A1 | 9/2004 | Lopez-Avila |
| 2004/0250750 | A1 | 12/2004 | Reda et al. |
| 2005/0020702 | A1 | 1/2005 | Li et al. |
| 2005/0089684 | A1 | 4/2005 | Barron et al. |
| 2005/0119360 | A1 | 6/2005 | Kawakami et al. |
| 2005/0238889 | A1 | 10/2005 | Iwamoto et al. |
| 2005/0263908 | A1 | 12/2005 | Nakagawa et al. |
| 2005/0279399 | A1 | 12/2005 | Gaudiana et al. |
| 2006/0002875 | A1 | 1/2006 | Winkler et al. |
| 2006/0024502 | A1 | 2/2006 | McFarland et al. |
| 2006/0071300 | A1 | 4/2006 | Haverty et al. |
| 2006/0093885 | A1 | 5/2006 | Krusic et al. |
| 2006/0106152 | A1 | 5/2006 | Metzinger et al. |
| 2006/0155376 | A1 * | 7/2006 | Asgari ............ 623/16.11 |
| 2006/0175685 | A1 | 8/2006 | Shin et al. |
| 2006/0185794 | A1 | 8/2006 | Ayers |
| 2009/0192281 | A1 | 7/2009 | Ayers |

FOREIGN PATENT DOCUMENTS

| | | |
|---|---|---|
| EP | 1 015 384 B1 | 7/2000 |
| EP | 1 063 197 A2 | 12/2000 |
| EP | 1 190 422 B1 | 3/2002 |
| EP | 1 244 731 B1 | 10/2002 |
| EP | 1 265 080 A2 | 12/2002 |
| EP | 1 473 770 A1 | 11/2004 |
| GB | 2 380 496 A | 4/2003 |
| JP | 5-254955 A | 10/1993 |
| JP | 6-324681 A | 11/1994 |
| JP | 8-181133 A | 7/1996 |
| JP | 8-245209 A | 9/1996 |
| JP | 9-316202 A | 12/1997 |
| JP | 10-310709 A | 11/1998 |
| JP | 11-263916 A | 9/1999 |
| JP | 2000-154191 A | 6/2000 |
| JP | 2000-268632 A | 9/2000 |
| JP | 2001-192322 A | 7/2001 |
| JP | 2002-6478 A | 1/2002 |
| JP | 2002-72964 A | 3/2002 |
| JP | 2003-3047 A | 1/2003 |
| JP | 2003-3119 A | 1/2003 |
| JP | 2003-176113 A | 6/2003 |
| JP | 2003-280249 A | 10/2003 |
| JP | 2003-321214 A | 11/2003 |
| JP | 2004-182771 A | 7/2004 |
| JP | 2005-53832 A | 3/2005 |
| JP | 2005-105152 A | 4/2005 |
| JP | 2005-119167 A | 5/2005 |
| JP | 2005-144601 A | 6/2005 |
| JP | 2005-263509 A | 9/2005 |
| JP | 2005-268550 A | 9/2005 |
| JP | 2005-272639 A | 10/2005 |
| JP | 2005-289755 A | 10/2005 |
| JP | 2005-290316 A | 10/2005 |
| WO | WO 98/07793 A1 | 2/1998 |
| WO | WO 00/68956 A1 | 11/2000 |
| WO | WO 01/25316 A1 | 4/2001 |
| WO | WO 01/78110 A2 | 10/2001 |
| WO | WO 01/91922 A2 | 12/2001 |
| WO | WO 02/06366 A1 | 1/2002 |
| WO | WO 02/30814 A1 | 4/2002 |
| WO | WO 02/081546 A1 | 10/2002 |
| WO | WO 03/018645 A1 | 3/2003 |
| WO | WO 03/057749 A1 | 7/2003 |
| WO | WO 03/060979 A2 | 7/2003 |
| WO | WO 03/061029 A2 | 7/2003 |
| WO | WO 04/000909 A1 | 12/2003 |
| WO | WO 2004/079814 A2 | 9/2004 |
| WO | WO 2005/008761 A1 | 1/2005 |
| WO | WO 2005/010071 A1 | 2/2005 |
| WO | WO 2005/028174 A2 | 3/2005 |
| WO | WO 2006/023921 A2 | 3/2006 |
| WO | WO 2006/028704 A2 | 3/2006 |
| WO | WO 2006/028776 A1 | 3/2006 |

OTHER PUBLICATIONS

Zhang et al, Polymer, 44, pp. 2647-2654, 2003.*

Bell et al, Proceedings—Electrochemical Society, 92-94, pp. 92-106, 1994.*

Xia et al, Proceedings of SPIE, 3136, pp. 57-61, 1997.*

Xia et al, Fullerene Science and Technology, 9(2), pp. 161-166, 2001.*

Chen, K., et al., "Fullerene Self-Assembly onto $(MeO)_3Si(CH_2)_3NH_2$-Modified Oxide Surfaces," *J. Am. Chem. Soc.* 115:1193-1194, American Chemical Society (1993).

Hirsch, A., et al., "Globe-trotting Hydrogens on the Surface of the Fullerene Compound $C_{60}H_6(N(CH_2CH_2)_2O)_6$," *Angew. Chem. Int. Ed. Engl.* 30:1309-1310, VCH Verlagsgesellschaft mbH (1991).

Hirsch, A., et al., "Regioselective Multiple Additions to Buckminsterfullerene," in *The Chemical Physics of Fullerenes 10 (and 5) Years Later*, Andreoni, W., ed., Kluwer Academic Publishers, Boston, MA, pp. 267-283 (1996).

Jenekhe, S.A., and Chen, X.L., "Self-Assembly of Ordered Microporous Materials from Rod-Coil Block Copolymers," *Science* 283:372-375, American Association for the Advancement of Science (1999).

Liang, C., et al., "Synthesis of a Large-Scale Highly Ordered Porous Carbon Film by Self-Assembly of Block Copolymers," *Angew. Chem. Int. Ed.* 43:5785-5789, Wiley-VCH Verlag GmbH & Co. KGaA (Nov. 2004).

Maggini, M., et al., "$C_{60}$ Derivatives Embedded in Sol-Gel Silica Films," *Adv. Mater.* 7:404-406, VCH Verlagsgesellschaft mbH (1995).

Ouyang, J., et al., "Structures and Properties of Supramolecular Assembled Fullerenol/Poly(dimethylsiloxane) Nanocomposites," *J. Phys. Chem. B* 108:5937-5943, American Chemical Society (May 2004).

Wudl, F., et al., "Survey of Chemical Reactivity of $C_{60}$, Electrophile and Dieno-polarophile Par Excellence," in *ACS Symposium Series—Fullerenes*, Hammond, G.S., and Kuck, V.J., eds., American Chemical Society, Washington, DC, pp. 161-175 (1992).

Yevlampieva, N., et al., "Star-like Fullerene Containing Poly(Vinylpyrrolydone) Derivatives: Chloroform Solution Properties," *Fullerenes, Nanotubes, and Carbon Nanostructures* 12:353-359, Marcel Dekker, Inc. (Aug. 2004).

Patent Abstracts of Japan, unverified English language abstract for JP 5-254955 A (Document FP1 listed on accompanying PTO/SB/08A).

Patent Abstracts of Japan, unverified English language abstract for JP 6-324681 A (Document FP2 listed on accompanying PTO/SB/08A).

Patent Abstracts of Japan, unverified English language abstract for JP 8-181133 A (Document FP4 listed on accompanying PTO/SB/08A).

Patent Abstracts of Japan, unverified English language abstract for JP 8-245209 A (Document FP5 listed on accompanying PTO/SB/08A).

Patent Abstracts of Japan, unverified English language abstract for JP 9-316202 A (Document FP6 listed on accompanying PTO/SB/08A).

Patent Abstracts of Japan, unverified English language abstract for JP 11-0263916A (Document FP7 listed on accompanying PTO/SB/08A).

Patent Abstracts of Japan, unverified English language abstract for JP 10-310709 A (Document FP8 listed on accompanying PTO/SB/08A).

Patent Abstracts of Japan, unverified English language abstract for JP 2000-154191 A (Document FP10 listed on accompanying PTO/SB/08A).

Patent Abstracts of Japan, unverified English language abstract for JP 2000-268632 A (Document FP11 listed on accompanying PTO/SB/08A).

Patent Abstracts of Japan, unverified English language abstract for JP 2001-192322 A (Document FP15 listed on accompanying PTO/SB/08A).

Patent Abstracts of Japan, unverified English language abstract for JP 2002-6478 A (Document FP18 listed on accompanying PTO/SB/08A).

Patent Abstracts of Japan, unverified English language abstract for JP 2002-72964 A (Document FP19 listed on accompanying PTO/SB/08A).

Patent Abstracts of Japan, unverified English language abstract for JP 2003-3047 A (Document FP26 listed on accompanying PTO/SB/08A).

Patent Abstracts of Japan, unverified English language abstract for JP 2003-3119 A (Document FP27 listed on accompanying PTO/SB/08A).

Patent Abstracts of Japan, unverified English language abstract for JP 2003-176113 A (Document FP30 listed on accompanying PTO/SB/08A).

Patent Abstracts of Japan, unverified English language abstract for JP 2003-280249 A (Document FP34 listed on accompanying PTO/SB/08A).

Patent Abstracts of Japan, unverified English language abstract for JP 2003-321214 A (Document FP36 listed on accompanying PTO/SB/08A).

Patent Abstracts of Japan, unverified English language abstract for JP 2004-182771 A (Document FP37 listed on accompanying PTO/SB/08A).

Patent Abstracts of Japan, unverified English language abstract for JP 2005-53832 A (Document FP42 listed on accompanying PTO/SB/08A).

Patent Abstracts of Japan, unverified English language abstract for JP 2005-105152 A (Document FP44 listed on accompanying PTO/SB/08A).

Patent Abstracts of Japan, unverified English language abstract for JP 2005-119167 A (Document FP45 listed on accompanying PTO/SB/08A).

Patent Abstracts of Japan, unverified English language abstract for JP 2005-144601 A (Document FP46 listed on accompanying PTO/SB/08A).

Patent Abstracts of Japan, unverified English language abstract for JP 2005-263509 A (Document FP47 listed on accompanying PTO/SB/08A).

Patent Abstracts of Japan, unverified English language abstract for JP 2005-268550 A (Document FP48 listed on accompanying PTO/SB/08A).

Patent Abstracts of Japan, unverified English language abstract for JP 2005-272639 A (Document FP49 listed on accompanying PTO/SB/08A).

Patent Abstracts of Japan, unverified English language abstract for JP 2005-289755 A (Document FP50 listed on accompanying PTO/SB/08A).

Patent Abstracts of Japan, unverified English language abstract for JP 2005-290316 A (Document FP51 listed on accompanying PTO/SB/08A).

Dialog File 351, Accession No. 7111280, unverified English language abstract for EP 0 647 606 A1 (Document FP3 listed on accompanying PTO/SB/08A).

Jena, P., and Khanna, S.N., "Physics of cluster assembled materials," *Mater. Sci. Eng. A217/A218*:218-222, Elsevier Science S.A. (1996).

Matsuura, M., et al., "On the role of small additives for nanocrystalline formation from amorphous matrix," *Mater. Sci. Eng. A217/A218*:397-400, Elsevier Science S.A. (1996).

Ohno, K., et al., "Ab-initio molecular dynamics study of the stability and reactivity of $C_{60}$," *Mater. Sci. Eng. A217/A218*:19-22, Elsevier Science S.A. (1996).

Co-pending U.S. Appl. No. 11/806,464, inventor Ayers, M.R., filed May 31, 2007.

Co-pending U.S. Appl. No. 11/806,463, inventor Ayers, M.R., filed May 31, 2007.

Co-pending U.S. Appl. No. 11/806,482, inventor Ayers, M.R., filed May 31, 2007.

The International Search Report completed for Application No. PCT/US07/12836 on Sep. 20, 2007 and mailed on Nov. 5, 2007.

The International Search Report completed for Application No. PCT/US07/12835 on Oct. 3, 2007 and mailed on Nov. 28, 2007.

The International Search Report completed for Application No. PCT/US07/12831 on Oct. 19, 2007 and mailed on Dec. 5, 2007.

A Non-Final Office Action issued in the co-pending U.S. Appl. No. 10/906,534 on Nov. 27, 2007.

The International Search Report completed for Application No. PCT/US07/12832 on Oct. 24, 2007 and mailed on Dec. 18, 2007.

Ulug et al., Fullerene Science and Technology, 5(7), 1997, pp. 1651-1658.

Wang, Tetrahedron, 58, 2002, pp. 2377-2380.

Office Action in parent U.S. Appl. No. 10/906,534, mailed on Nov. 27, 2007.

Office Action in related parent U.S. Appl. No. 10/906,534, mailed on Jun. 30, 2008.

Non Final Office Action in U.S. Appl. No. 12/418,314, mailed Sep. 29, 2010, 7 pgs.

Non Final Office Action in U.S. Appl. No. 11/806,464, mailed Jan. 20, 2010, 6 pgs.

Final Office Action in U.S. Appl. No. 11/806,464, mailed May 14, 2010, 6 pgs.

Non Final Office Action in U.S. Appl. No. 11/806,463, mailed Jan. 20, 2010, 8 pgs.

Final Office Action in U.S. Appl. No. 11/806,463, mailed May 5, 2010, 8 pgs.

Non Final Office Action in U.S. Appl. No. 11/806,482, mailed Jan. 27, 2010, 6 pgs.

* cited by examiner

LINKED PERIODIC NETWORKS OF ALTERNATING CARBON AND INORGANIC CLUSTERS FOR USE AS LOW DIELECTRIC CONSTANT MATERIALS

CROSS REFERENCE TO RELATED APPLICATIONS

This application claims the benefit of U.S. Provisional Patent Application No. 60/809,348, filed May 31, 2006, the disclosure which is incorporated by reference herein in its entirety.

BACKGROUND OF THE INVENTION

Field of the Invention

This disclosure relates generally to fullerene-comprising compounds, methods of preparing such compounds, and to their subsequent use as low dielectric constant materials in microelectronic devices.

BRIEF SUMMARY OF THE INVENTION

In one embodiment, the present invention provides methods for preparing a fullerene polymer film. A fullerene monomer having at least one reactive arm is provided. The fullerene monomer is dissolved in a solvent. A plurality of fullerene monomers is then deposited onto a substrate. The fullerene monomers are then cured to form a fullerene polymer film. In exemplary embodiments, the fullerene monomers comprise a fullerene (e.g., $C_{60}$) and at least one reactive arm comprising: a reactive group coupled to the fullerene; an organic spacer portion; and a metal or metalloid alkoxide. In suitable embodiments, the reactive arms comprise: an amine, an azide, a diene, or a carbanion; an alkyl organic spacer portion; and a metal or metalloid alkoxide selected from the group consisting of —$Si(OR)_3$, —$Ge(OR)_3$—$Ti(OR)_3$, —$Zr(OR)_3$, —$Sn(OR)_3$, —$Al(OR)_2$ and —$B(OR)_2$. Exemplary reactive arms include, but are not limited to, 3-aminopropyltrimethoxysilane, 3-aminopropyltriethoxysilane, 2-aminoethyl-3-aminopropyltrimethoxysilane, 2-aminoethyl-3-aminopropyltriethoxysilane, diethyl-enetriaminopropyltrimethoxysilane, hexanediaminomethyltriethoxysilane and 11-aminoundecyltriethoxysilane.

In suitable embodiments, the depositing comprises spin-coating, dip-coating or spray-coating and the curing comprises thermo-chemical curing (e.g., heating to between about 80° C. to 200° C. in a moist atmosphere). Suitably the curing forms a silica cluster.

In a further embodiment, the present invention provides methods for preparing a fullerene polymer film. For example, a fullerene monomer having at least one reactive arm is pre-condensed to form at least one fullerene polymer network fragment. The fullerene polymer network fragment is dissolved in a solvent. Then, a plurality of fullerene polymer network fragments is deposited onto a substrate. Then, the fullerene polymer network fragments are cured to form a fullerene polymer film. Exemplary reactive arms, as well as methods for depositing and curing, for use in the practice of the methods are described throughout. In suitable embodiments, the precondensing comprises reacting a metal or metal alkoxides with water.

The present invention also provides fullerene polymer films comprising two or more fullerene molecules and two or more reactive arms, each comprising an amine or secondary amine, an organic spacer portion and a metal or metalloid alkoxide, wherein the reactive arms are coupled to the fullerene molecules via the amine or secondary amine, and the fullerene molecules are linked to each other via an oxide bond.

BRIEF DESCRIPTION OF THE DRAWINGS/FIGURES

FIG. 1 shows a polyfunctional fullerene monomer where the number of reactive arms is six. Portions of the molecule obscured by other parts have been omitted for clarity.

Figure 2:
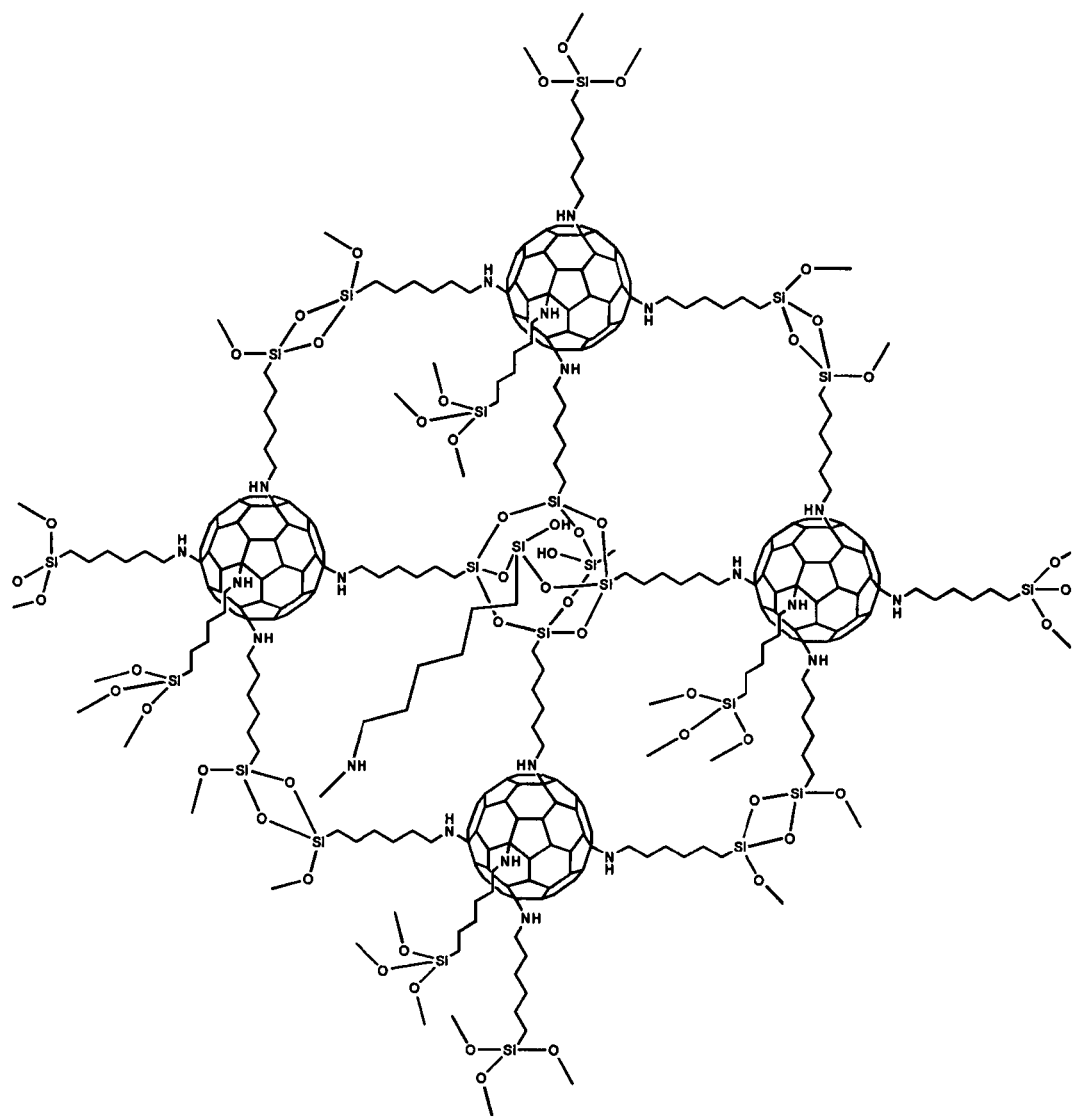

FIG. 2 shows a section of a final fullerene polymer network. Portions of the molecule obscured by other parts have been omitted for clarity. Four fullerene monomers surround a silica cluster are formed by the condensation of terminal groups. Portions of silica clusters from adjacent repeating units are shown as well.

Figure 3:
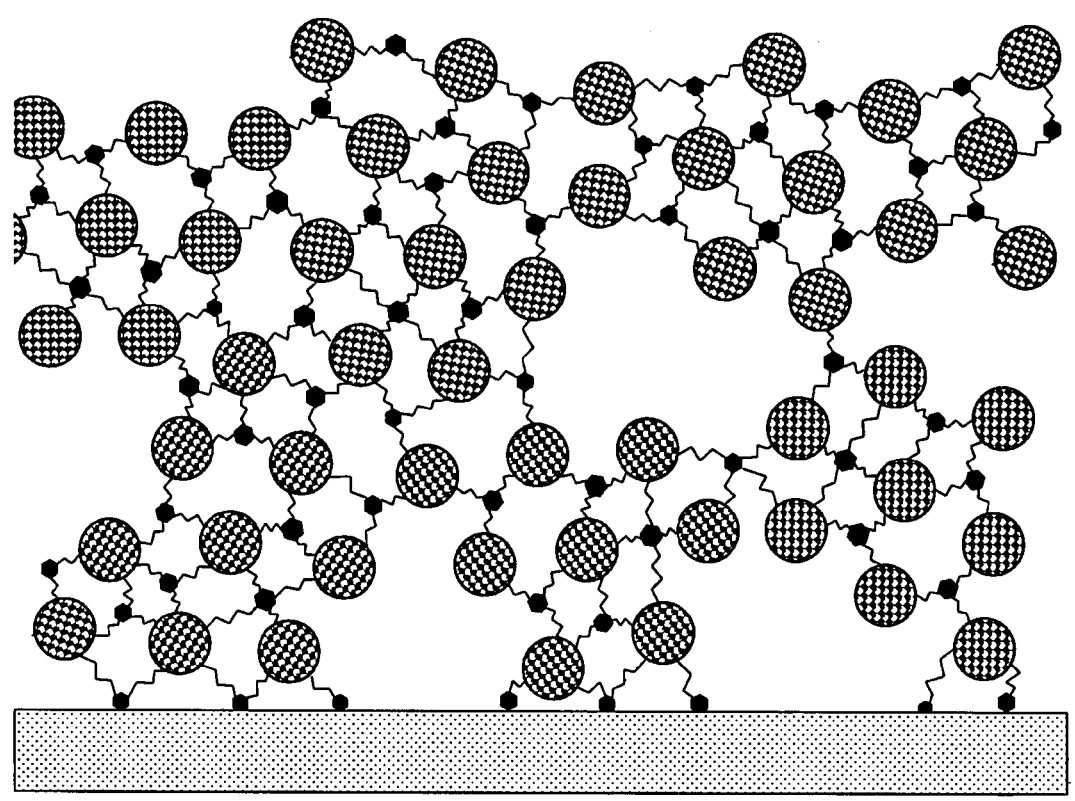

FIG. 3 shows a section of the final fullerene polymer film after deposition onto a solid substrate and final curing. Fullerene cages are represented by hashed circles, junctions formed by the condensation of terminal groups of the radial arms are shown as black hexagons, and the solid substrate is dotted.

Figure 4:
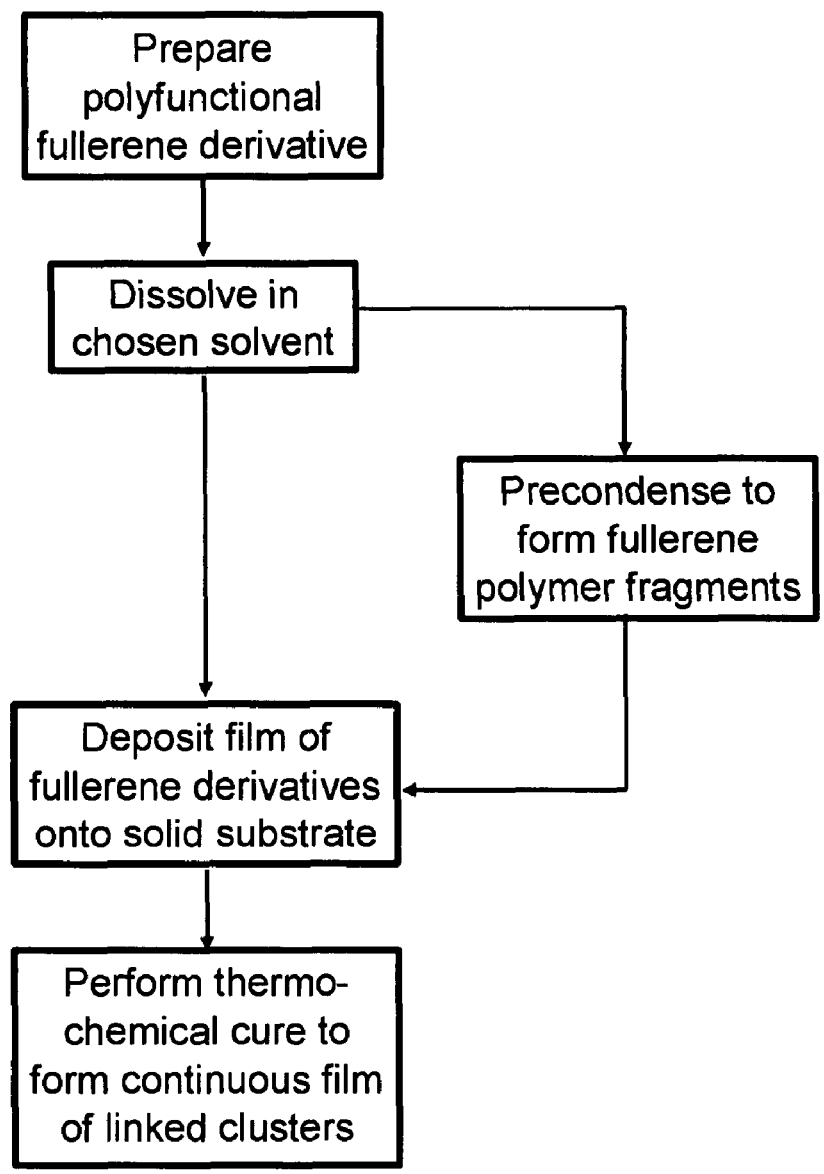

FIG. 4 gives a schematic representation of a process for preparing a fullerene polymer film.

DETAILED DESCRIPTION OF THE INVENTION

Polyfunctional fullerene monomers, also called "fullerene monomers," or "monomers" throughout, are well-suited for forming three-dimensional networks of cage compounds and comprise a central fullerene core symmetrically derivatized by one or more reactive arms. The molecules prepared in this way possess the ability to form inorganic clusters at the point of condensation with adjacent fullerene monomers. The fullerene monomers are largely composed of fragments exhibiting intrinsically low dielectric constants. Methods for polymerizing fullerene monomers as films on a desired substrate, for example when such films are used as intra- or interlayer dielectrics for microelectronic devices, are also disclosed. Any preparative route that produces a polyfunctional fullerene monomer, where the fullerene is surrounded by multiple arms each terminated by a reactive group may be used. The use of a bifunctional coupling agent to form the reactive arms that contain, at one end an amine group and at the opposite end a metal- or metalloid-alkoxide are disclosed. Any coupling agent which is capable of both reacting with a fullerene and undergoing condensation reactions with other identical coupling agents may be used.

The fullerene core of the polyfunctional fullerene monomer may be $C_{60}$, or may also comprise any of the following, $C_{70}$, $C_{72}$, $C_{74}$, $C_{76}$, $C_{78}$, $C_{84}$, $C_{96}$, and higher analogues up to, and beyond, $C_{184}$ or mixtures thereof. Commercially available mixtures of $C_{60}$ and $C_{70}$, commonly known as Fullerite, fullerene extract, or fullerene soot may also be employed.

Compounds that are well-suited to form the reactive arms of the polyfunctional monomers are readily available, and for example, contain three general parts; a terminal group known to react with fullerenes, a linear organic spacer, and an opposing terminal group capable of undergoing multiple condensation reactions with similar groups.

For example, a terminal group used to couple the reactive arms to the fullerene core may be a primary or secondary amine. Amines are known to those skilled in the art to react with fullerenes in a facile manner by nucleophilic addition reactions across one of the many delocalized bonds of the fullerene cage. Anywhere from one to twelve amine molecules may be added to a single $C_{60}$ molecule, the actual number depending largely on their stearic bulk, with the most common number of additions being six. Other reactive groups, especially other nucleophiles, may be used. These include, but are not limited to, azides, dienes, and carbanions. However, any reactive group which may be found to react with fullerenes may be employed.

The organic-spacer portion of the reactive arm may comprise an alkyl chain, a polyether chain, a polyunsaturated alkyl chain, or an amine-containing alkyl chain. The chain length of the spacer can be determined in part by the desired mechanical and electrical properties of the deposited network-polymer films. Shorter chain lengths, for example 3 or 4 carbon units long, provide greater rigidity, while longer chains of 10-20 carbon units result in greater flexibility. For example, the organic spacer can be an alkyl chain 3-20 carbon units long, e.g., 3-7 carbon units long. However, when greater rigidity is desirable, the alkyl chain may include one or more heteroatomic groups, such as ether groups or amino groups, or one or more rigid components, including, but not limited to, alkynyl-segments, aryl-segments, or other cyclic segments.

The terminal reactive group used for forming the three-dimensional network may be comprised of any of several common functionalities. For example, a metal- or metalloid-alkoxide may be used as a terminal group. Alkoxides readily undergo hydrolysis and condensation reactions, forming polymeric oxides, and bond with, upon hydrolysis, the chemically similar surfaces of solid oxides. Any one of numerous possible alkoxide groups may be used, including, but not limited to, $-Si(OR)_3$, $-Ge(OR)_3$—$Ti(OR)_3$, $-Zr(OR)_3$, $-Sn(OR)_3$, $-Al(OR)_2$ and $-B(OR)_2$.

The following are non-limiting examples of commercially available reactive arms; 3-aminopropyltrimethoxysilane, 3-aminopropyltriethoxysilane, 2-aminoethyl-3-aminopropyltrimethoxysilane, 2-aminoethyl-3-aminopropyltriethoxysilane, diethylenetriaminopropyltrimethoxysilane, hexanediaminomethyltriethoxysilane and 11-aminoundecyltriethoxysilane. However, many additional compounds may prove useful.

A polyfunctional fullerene monomer may be prepared as follows. The desired amount of the selected fullerene core is added to a large excess of the selected coupling agent that will ultimately become the reactive arm on the fullerene monomer. Initially, the fullerene is insoluble in the coupling agent/reactive arm and is present as a fine black suspension. Reaction of the amine group of the coupling agent/reactive arm with the fullerene occurs readily at ambient temperature; however, heating the mixture to about 50-60° C. allows the reaction to proceed at a faster rate. As the reaction proceeds, the partially derivatized fullerenes exhibit increased solubility in the coupling agent/reactive arm and the mixture exists as a dark brown solution. After approximately 18 hours, starburst-shaped polyfunctional fullerene monomers are formed with reactive arms, typically six, being added to the fullerene core. The unreacted coupling agent/reactive arm is removed using vacuum-distillation and recovered for use in future preparations, leaving a deep brown-black residue containing the polyfunctional fullerene monomer with at least one reactive arm. FIG. 1 shows an example of such a compound, with $C_{60}$ as the fullerene and reactive arms derived from 6-aminohexyltriethoxysilane. The residue is redissolved in a solvent suitable for application to the desired substrate, such as ethanol.

When the coupling agent/reactive arm is not a liquid at ambient temperature, or when it is desired to add less reactive arms to each fullerene core, the reaction between the fullerene and the coupling agent/reactive arm may be performed in an appropriate solvent. Fullerenes typically posses much more limited solubility than the coupling agents/reactive arms, so the solvent chosen should exhibit good solvating ability towards fullerenes. Example solvents include, but are not limited to, toluene, xylenes, carbon disulfide, 1,2-dichlorobenzene, 1-methylnapthalene, and 1-chloronapthalene. The amount of coupling agents/reactive arms desired on the fullerene monomer is added to a solution of fullerene in the selected solvent. The mixture is held at an elevated temperature for 24 hours to remove the solvent from the dark red-brown solution. As above, the residue may be redissolved in a suitable solvent for future use.

Polyfunctional fullerene monomers possess a high solubility in many common organic solvents, including alkanes, toluene, benzene, ketones, and alcohols. The latter are especially useful as alcohols, such as ethanol and 2-propanol, and are common and desirable solvents employed for the deposition of spin-on inorganic films in the microelectronics industry.

Fullerene monomers possess the ability to form crosslinked networks. With typically six or more reactive arms surrounding each fullerene core, each fullerene monomer can form strong links to six or more neighboring fullerene monomers. Highly crosslinked polymers show significant increases in both thermal stability and mechanical strength relative to similar polymers that are less crosslinked. Both of these qualities are extremely important for a material that is intended for use in microelectronic devices, where temperatures of about 400° C. in addition to strong mechanical forces, are common during processing. The fullerene monomers also possess the ability to form strong bonds to the common substrates encountered in microelectronic structures. These are typically oxides or metals, two classes of materials that are well known in the art to form strong bonds to films derived from alkoxides. Excellent film adhesion is a property that a dielectric material suitably possess to achieve use in practice. With multiple reactive arms per repeating unit, fullerene monomers are well-suited to form strong bonds to a desired substrate.

FIG. 4 is a schematic representation of a process for preparing a fullerene polymer film, comprising (a) preparing a fullerene monomer (i.e. a polyfunctional fullerene derivative) having at least one reactive arm; (b) dissolving the fullerene monomer in a solvent; (c) depositing a plurality of fullerene monomers onto a substrate (i.e. as a film); and (d) curing (e.g. thermochemically curing) the fullerene monomers to form a fullerene polymer film. The fullerene monomers may also be precondensed to form fullerene polymer fragments prior to depositing onto a substrate.

A solution of a plurality of polyfunctional fullerene monomers can be applied to a desired substrate by any method commonly employed in the art, such as spin-coating, dip-coating, or spray-coating. As used herein, the term "plurality" is meant to indicate more than one, e.g., 2, 5, 10, 50, 100, 1000, etc., of an article. A subsequent thermo-chemical curing step initiates the hydrolysis and condensation reactions of the terminal alkoxide groups, forming the alternating network of carbon and inorganic clusters. A section of such a network is shown in FIG. 2, where the terminal alkoxide groups of adjacent monomers have condensed to form a small silica cluster. In the network structure shown in FIG. 2, each fullerene core is surrounded by six silica clusters, and each silica cluster is surrounded by six fullerene cores (portions of the structure extending below the plane of the drawing have been omitted for clarity). In the example given in FIG. 2 the silica clusters are linked to each other by alkane chains containing six carbon units.

The formation of the fullerene polymer film can be accomplished during a thermo-chemical curing step. This generally involves exposing the deposited film to conditions which are known to cause the removal of organic groups from alkoxides and their subsequent condensation. For most alkoxides, elevated temperatures in the presence of moisture are adequate to complete these reactions. Therefore, after a film of the polyfunctional fullerene monomers has been deposited on the desired substrate, the polymer film can be formed by heating the coated substrate under a moist atmosphere until all remaining alkoxide groups have been removed. This typically requires temperatures in the range between about 80 and 200° C., though higher temperatures may be employed.

FIG. 2 shows a network of fullerene monomers with an effectively octahedral symmetry. However, as each fullerene monomer may possess a slightly different number of reactive arms, and the condensation reactions leading to the network are somewhat random in nature, more amorphous structures may be produced. This can be attractive, as amorphous materials are less likely to exhibit anisotropy in their physical and electrical properties.

FIG. 3 shows a section of a final fullerene polymer film after deposition onto a solid substrate and final curing. Fullerene cages are represented by hashed circles, junctions formed by the condensation of terminal groups of the radial arms are shown as black hexagons, and the solid substrate is dotted. Microporosity can be seen due to the non-ideal packing of precondensed polymer fragments.

The electrical and mechanical properties of the fullerene polymeric films are dependent on the relative contributions of the three components of the network, namely the fullerene cores, the inorganic clusters (e.g., silica) and the linking chains. In the example of FIG. 2, less than 20% of the mass of the polymer network results from the inorganic cluster, therefore the electrical properties of the film will be dominated by the contribution of the organic portion. This will lead to a lower dielectric constant than would be found in a film with a high silica content.

Films with modified properties can be prepared by adjusting the number of reactive arms on the fullerene monomers, and their chain lengths. Fewer arms will give lower silica content and lower dielectric constants, but also lower crosslinking and consequently weaker films. Longer linking chains also result in a lower silica, content, as well as a more flexible network. The specific length and number of chains should therefore be chosen according to the performance requirements of the desired microelectronic device and the fabrication processes used in its manufacture.

The polyfunctional fullerene monomers may be partially condensed prior to deposition onto the substrate. This leads to the formation of small, soluble polymer network fragments with the general internal structure given in FIG. 2. Such fragments provide irregular packing upon film deposition, due in part to their non-spherical shapes, and introduce a considerable amount of microporosity into the final cured film. Microporosity is desirable as the inclusion of porosity into dielectric films is one of few available methods for preparing films with very low dielectric constants, such as below 2.0.

The level of precondensation is limited by two important factors relevant to microelectronics fabrication. One of these is the need to maintain a high level of solubility of the precondensed network fragments prior to deposition. Excessive precondensation will form network fragments that are too large to be kept in solution. Another factor limiting the amount of precondensation used is the need to limit the size of the pores resulting from the non-ideal packing of the fragments. With current and anticipated length scales found in microelectronic devices, pores much larger than about 1-3 nm in diameter are potential defect points for the device in question. The size of the precondensed fragment can be limited to roughly about 10-nm in diameter or less. Typical packing of fragments of that size will result in the formation interstitial pores of an acceptable size.

The precondensation of the polyfunctional fullerene monomer can be accomplished by reaction with water. Large amounts of water will tend to form larger network fragments. The amount of water required to form the smallest possible network fragment, namely the linkage of two monomers together, is about 0.5 mol per mol of monomer. Conversely, the amount of water required to affect complete hydrolysis and condensation of the terminal alkoxides, producing a fully-formed network, is about 9.0 mol per mol of monomer when the average number of reactive arms is six. Therefore, the amount of water used generally will lie within this range. In practice, to keep fragments from growing too large, about 0.75-2.0 mol of water per mol of monomer is sufficient, though any amount may be used.

The precondensation step can be accomplished by adding the desired amount of water to a solution of fullerene monomer in a suitable solvent, such as ethanol. If the reactive arms contain amine functionalities, the resulting increased pH will catalyze the hydrolysis and condensation of the alkoxides. However, additional amounts of acid or base catalysts may be added if desired. Typical reaction times for this process are 24-48 hours, though the rate of reaction can be accelerated by increasing the reaction temperature. Film deposition and curing are achieved in the same way as mentioned above.

Particle growth in the precondensation step mentioned above may be further controlled by preparing fullerene monomers with reactive arms terminated by different alkoxide groups within the same fullerene monomer molecule. One or more reactive arms may be terminated by an alkoxide exhibiting a rate of hydrolysis that is notably slower than that shown by the terminal alkoxides of the remaining arms of the same molecule. The rate of hydrolysis of alkoxides is most easily modified by stearic factors of the group —OR, and by selection of a larger group for R, the rate of hydrolysis may be substantially reduced. An example of the relative rates of hydrolysis for several possible R groups, well known to those skilled in the art, is methyl>ethyl>t-butyl>benzyl. Therefore, in a polyfunctional fullerene monomer containing a small number of terminal —Si(OCH$_3$)$_3$ groups with the remainder being terminated by —Si(O-t-C$_4$H$_9$)$_3$, the higher rate of hydrolysis of the methoxy groups will lead to the formation of smaller network fragments upon precondensation.

EXAMPLES

Example 1

The following non-limiting example demonstrates the experimental conditions to prepare three-dimensional polymer networks containing linked fullerene monomers, useful as low dielectric constant materials.

A polymeric network of fullerene monomers with a low dielectric constant was prepared as follows. A solution of a polyfunctional starburst-shaped fullerene molecules to be used as a fullerene monomer for the polymer film was prepared as follows. 0.50 grams of C$_{60}$ was mixed with 20 mL of 6-aminohexyltriethoxysilane in a 100-mL schlenk flask. The flask was flushed with dry nitrogen, and the mixture heated to 60° C. for 24 hours. During that time the mixture slowly changed from a clear liquid containing a fine black suspended powder to a dark brown solution with a moderate amount of a thick brown precipitate. The remaining 6-aminohexyltriethoxysilane was removed by vacuum distillation. This should be accomplished at the lowest possible pressure so that lower distillation temperatures may be employed. After the brown-black residue was dry, a 0.250-gram portion was removed and dissolved in 15 mL of anhydrous ethanol. This solution was filtered to remove any undissolved material and reserved for use in the next step.

The solution prepared above was coated onto a 2×2-cm section of silicon wafer and allowed to air dry. The coated substrate was then heated to 60° C. for 30 minutes to remove residual solvent. The temperature was then increased to 150° C. and the substrate was held at that temperature under an atmosphere of moist air for 60 minutes. An additional 30 minutes at 300° C. under nitrogen completed the curing process. The resulting brown film exhibited excellent adhesion and scratch resistance and is well-suited for use as a low dielectric constant material.

Example 2

The following non-limiting example demonstrates the experimental conditions needed to prepare three-dimensional polymer networks containing linked fullerene monomers, useful as low dielectric constant materials.

A polyfunctional fullerene monomer was prepared according to the previous example, however, in this case the entire solid residue formed in the first step was dissolved in 40 mL of anhydrous ethanol. 15.6 μL of water was added to the resulting solution. The mixture was allowed to stand for 24 hours, and then coated onto a silicon substrate and cured as described in the precious example. The resulting film showed good adhesion and scratch resistance.

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. A fullerene polymer film on a substrate, the film consisting of:
   two or more fullerene molecules; and
   two or more reactive arms bridging the fullerene molecules, each reactive arm coupled to the fullerene molecules via an amine and including an organic spacer portion linked to the amine and terminating in a metal or metalloid alkoxide;
   wherein the fullerene molecules are linked to each other via an oxide bond, and wherein the fullerene molecules are bonded to the substrate.

2. The fullerene polymer film of claim 1, wherein the fullerenes are selected from the group consisting of: $C_{60}$, $C_{70}$, $C_{72}$, $C_{76}$, $C_{78}$, $C_{84}$, $C_{96}$, and mixtures thereof.

3. The fullerene polymer film of claim 1, wherein the metal or metalloid alkoxide is selected from the group consisting of: —Si(OR)$_3$, —Ge(OR)$_3$, —Ti(OR)$_3$, —Zr(OR)$_3$, —Sn(OR)$_3$, —Al(OR)$_2$, and B(OR)$_2$.

4. The fullerene polymer film of claim 1, wherein the two or more reactive arms comprise an amine selected from the group consisting of: 3-aminopropyltrimethoxysilane, 3-aminopropyltriethoxysilane, 2-aminoethyl-3-aminopropyltrimethoxysilane, 2-aminoethyl-3-aminopropyltriethoxysilane, diethyl-enetriaminopropyltrimethoxysilane, hexanediaminomethyltriethoxysilane, and 11-aminoundecyltriethoxysilane.

5. The fullerene polymer film of claim 1, wherein the substrate comprises a metal.

6. The fullerene polymer film of claim 1, wherein the substrate comprises an oxide.

7. The fullerene polymer film of claim 1, wherein the organic spacer portion comprises an alkyl chain that includes 3 to 20 carbon atoms.

8. The fullerene polymer film of claim 1, wherein the organic spacer portion comprises an alkyl chain that includes 3 to 7 carbon atoms.

9. The fullerene polymer film of claim 1, wherein the organic spacer portion comprises an alkyl chain that includes 10 to 20 carbon atoms.

10. The fullerene polymer film of claim 1, wherein the organic spacer portion comprises an alkyl chain that includes one or more groups selected from: an ether group, an amino group, an alkynyl group, or an aryl group.

11. The fullerene polymer film of claim 1, comprising a fullerene molecule having six reactive arms.

12. The fullerene polymer film of claim 1, wherein the fullerenes are $C_{60}$.

13. The fullerene polymer film of claim 1, wherein the fullerene polymer film has a dielectric constant of less than about 2.

14. The fullerene polymer film of claim 1, wherein the fullerene molecules are bonded to the substrate via an oxide bond.

* * * * *

UNITED STATES PATENT AND TRADEMARK OFFICE
CERTIFICATE OF CORRECTION

PATENT NO. : 7,919,188 B2  
APPLICATION NO. : 11/806465  
DATED : April 5, 2011  
INVENTOR(S) : Ayers Page 1 of 1

It is certified that error appears in the above-identified patent and that said Letters Patent is hereby corrected as shown below:

Title Page, item (73), under "Assignee", in Column 1, Lines 1-2, delete "Las Vegas, NV (US)" and insert -- La Vegas, NV (US) 89119 --.

Signed and Sealed this  
Second Day of August, 2011

David J. Kappos  
*Director of the United States Patent and Trademark Office*